US012794486B2

(12) United States Patent
Ge et al.

(10) Patent No.: US 12,794,486 B2

(45) Date of Patent: Nov. 10, 2026

(54) COMPARATORS AND ANALOG-TO-DIGITAL CONVERTERS USING NON-VOLATILE MEMORY DEVICES

(71) Applicant: TetraMem Inc., Fremont, CA (US)

(72) Inventors: Ning Ge, Danville, CA (US); Hengfang Zhu, Fremont, CA (US); Sangsoo Lee, Fremont, CA (US); Wenbo Yin, San Jose, CA (US)

(73) Assignee: TetraMem Inc., San Jose, CA (US)

( * ) Notice: Subject to any disclaimer, the term of this patent is extended or adjusted under 35 U.S.C. 154(b) by 0 days.

(21) Appl. No.: 18/147,576

(22) Filed: Dec. 28, 2022

(65) Prior Publication Data

US 2024/0137037 A1 Apr. 25, 2024

Related U.S. Application Data

(60) Provisional application No. 63/380,901, filed on Oct. 25, 2022.

(51) Int. Cl.
*H03M 1/12* (2006.01)
*H03M 1/34* (2006.01)

(52) U.S. Cl.
CPC ..................................... *H03M 1/34* (2013.01)

(58) Field of Classification Search
CPC ...... H03M 1/361; H03M 1/001; H03M 1/123; H03M 1/142; H03M 1/144; H03M 1/146; H03M 1/34; H03M 1/38; H03M 1/46; H03M 1/56; G04F 10/005; G11C 11/1675; G11C 11/161; G11C 11/1673; G11C 11/18; G11C 11/54; G11C 13/0069; G11C 11/16; G11C 11/1653; G11C 11/1655; G11C 11/1657; G11C 11/1693; G11C 11/56; G11C 13/0007; G11C 13/0026;

(Continued)

(56) References Cited

U.S. PATENT DOCUMENTS 6,154,157 A * 11/2000 Wong ........................ G06J 1/00 341/110
6,335,698 B1 * 1/2002 Ker ....................... H03M 1/361 341/143

(Continued)

OTHER PUBLICATIONS

International Searching Authority (ISA)/US, International Search Report for PCT/US23/77787, Mar. 1, 2024, 2 pages.

(Continued)

*Primary Examiner* — Linh V Nguyen

(74) *Attorney, Agent, or Firm* — Jaffery Watson Hamilton & DeSanctis LLP

(57) ABSTRACT

The present disclosure provides a comparator including a non-volatile memory device. The comparator is configured to compare an analog input voltage and a reference voltage and produce a digital output indicative of the comparison result. The digital output may represent a resistance state of the non-volatile memory device in response to the application of the reference voltage and the analog input voltage to the comparator. The present disclosure further provides analog-to-digital converters (ADCs) utilizing the comparator. The non-volatile memory device includes, for example, a memristor device, an MRAM (Magnetoresistive random access memory) device, a phase-change memory (PCM) device, a floating gate, a spintronic device, etc.

15 Claims, 6 Drawing Sheets

(58) Field of Classification Search
CPC ... G11C 13/0028; G11C 13/004; G11C 14/00; G11C 14/0081; G11C 15/02; G11C 15/046; G11C 2013/0054; G11C 2213/77; G11C 27/005; G11C 27/02; G11C 27/024; G11C 7/06; G11C 7/1006; G11C 7/12; G11C 8/08; H10N 50/10; H10N 50/85; H10N 52/00; H10N 59/00; H10N 52/80
USPC .......................................... 341/155, 159, 158
See application file for complete search history.

(56) References Cited

U.S. PATENT DOCUMENTS

| | | | | |
|---|---|---|---|---|
| 6,346,898 | B1 | 2/2002 | Melanson | |
| 7,697,321 | B2 * | 4/2010 | Andre | G11C 11/15 365/158 |
| 9,240,799 | B1 * | 1/2016 | Wang | G11C 11/1675 |
| 10,200,058 | B1 * | 2/2019 | Choi | H01F 10/3272 |
| 10,217,798 | B2 * | 2/2019 | Hu | H10B 61/10 |
| 11,138,500 | B1 | 10/2021 | Mountain | |
| 2002/0196171 | A1 * | 12/2002 | Micheloni | G11C 27/005 341/156 |
| 2008/0246537 | A1 | 10/2008 | Aziz | |
| 2009/0009164 | A1 * | 1/2009 | Utsuno | G01R 33/07 324/251 |
| 2013/0076551 | A1 | 3/2013 | Marukame et al. | |
| 2015/0347896 | A1 * | 12/2015 | Roy | H03M 1/46 706/29 |
| 2016/0379695 | A1 | 12/2016 | Kulkarni et al. | |
| 2017/0229161 | A1 | 8/2017 | Kulkarni et al. | |
| 2019/0148701 | A1 | 5/2019 | Ashrafzadeh | |
| 2019/0261884 | A1 * | 8/2019 | Ge | A61B 5/335 |
| 2020/0110909 | A1 * | 4/2020 | Ge | G11C 11/1675 |

OTHER PUBLICATIONS

International Searching Authority (ISA)/US, Written Opinion for PCT/US23/77787, Mar. 1, 2024, 6 pages.

* cited by examiner

COMPARATORS AND ANALOG-TO-DIGITAL CONVERTERS USING NON-VOLATILE MEMORY DEVICES

CROSS-REFERENCE TO RELATED APPLICATIONS

The present application claims the benefits of U.S. Provisional Application No. 63/380,901, entitled "MEMRISTOR-BASED COMPARATORS FOR ANALOG-TO-DIGITAL CONVERTERS," filed Oct. 25, 2022, which is incorporated herein by reference in its entirety.

TECHNICAL FIELD

The implementations of the disclosure generally relate to semiconductor devices and, more specifically, to comparators and analog-to-digital converters using non-volatile memory devices.

BACKGROUND

An analog-to-digital converter (ADC) is a device or system that can convert an analog signal into a digital signal. It is an essential component of many modern electronic devices. A comparator is an essential element of many types of ADCs. The comparator may compare two inputs and output an output voltage representing a logic "1" or a logic "0".

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, an apparatus is provided. The apparatus includes: a first comparator including a first non-volatile memory device. The first comparator is to: receive a first reference voltage and an analog input voltage as inputs; and produce a first digital output indicative of a result of a comparison between an analog input voltage and a first reference voltage. The first digital output represents a first resistance state of the first non-volatile memory device in response to an application of the first reference voltage and the analog input voltage to the first comparator.

In some embodiments, the apparatus further includes an encoder that generates one or more binary values based at least in part on the first digital output generated by the first comparator.

In some embodiments, the first non-volatile memory device includes at least one of a memristor device, an MRAM (Magnetoresistive random access memory) device, a phase-change memory (PCM) device, a floating gate, or a spintronic device.

In some embodiments, the first non-volatile memory device is programmed to an initial resistance state before the application of the first reference voltage and the application of the analog input voltage to the first comparator. In some embodiments, the initial resistance state includes a high-resistance state or a low-resistance state.

In some embodiments, the first digital output indicates whether the first resistance state of the first non-volatile memory device is the high-resistance state or the low-resistance state.

In some embodiments, the apparatus further includes a voltage divider circuit to generate a plurality of reference voltages, wherein the plurality of reference voltage includes the first reference voltage.

In some embodiments, the voltage divider circuit includes a plurality of non-volatile memory devices connected in series.

According to one or more aspects of the present disclosure, methods for performing analog-to-digital conversion are provided. The methods include applying, to a first comparator including a first non-volatile memory device, a first reference voltage; applying an analog input voltage to the first comparator; and producing, using the first comparator, a first digital output indicative of a result of a comparison between the analog input voltage and the first reference voltage. The first digital output represents a first resistance state of the first non-volatile memory device in response to the application of the first reference voltage and the analog input voltage to the first comparator.

In some embodiments, the methods further include generating, by an encoder, one or more binary values based at least in part on the first digital output.

In some embodiments, the methods further include programming the first non-volatile memory device to an initial resistance state before the application of the first reference voltage and the analog input voltage to the first comparator, wherein the initial resistance state includes a high-resistance state or a low-resistance state.

In some embodiments, the methods further include programming the first non-volatile memory device to the initial resistance state after producing the first digital output.

In some embodiments, the methods further include applying, to a second comparator including a second non-volatile memory device, a second reference voltage and the analog input voltage; and producing, using the second comparator, a second digital output indicative of a result of a comparison between the analog input voltage and the second reference voltage.

In some embodiments, the methods further include producing, using a voltage divider circuit, a plurality of reference voltages including the first reference voltage, wherein the voltage divider circuit includes at least one non-volatile memory device.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1:
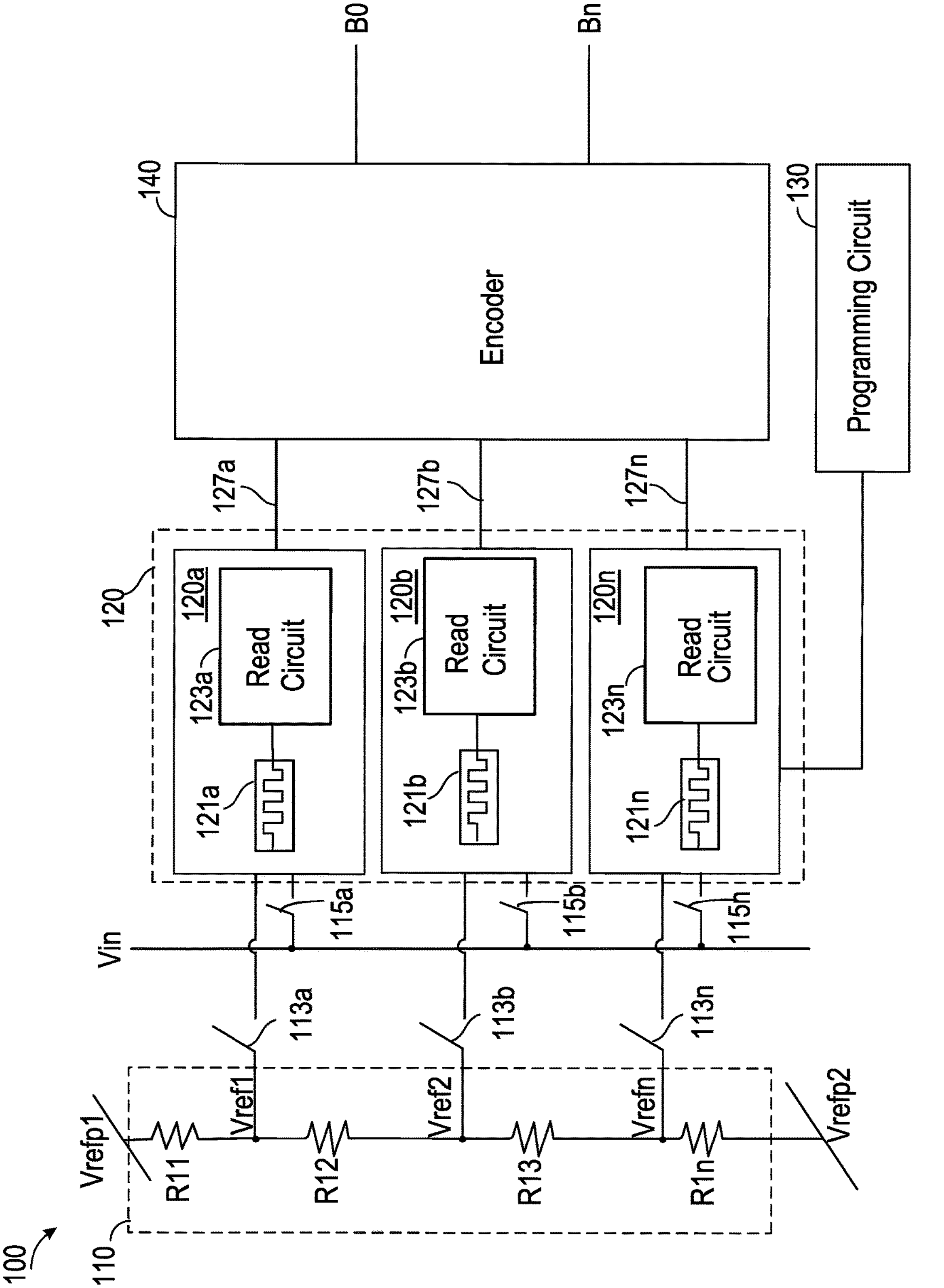
FIG. 1 is a schematic diagram illustrating an example analog-to-digital converter (ADC) in accordance with some embodiments of the present disclosure.

The present disclosure provides comparators and ADCs utilizing non-volatile memory devices. A comparator is an essential element of many ADCs. The comparator may compare two inputs and generate an output indicative of the comparison result. Many ADCs utilize complementary metal-oxide-semiconductor (CMOS) comparators. However, CMOS comparators typically use multiple transistors and have large device sizes to produce accurate comparison results. As such, CMOS comparators may not be suitable for ADCs or other applications that require a great number of comparators. For example, a FLASH ADC may require $2^n-1$ comparators for an n-bit conversion. As such, an 8-bit Flash ADC may have to utilize 255 comparators to produce an 8-bit digital output, which may be impractical due to its requirements of a vast chip area and very high-power consumption.

The present disclosure provides comparators and ADCs utilizing non-volatile memory devices (e.g., two-terminal devices with non-volatile and programmable resistance). Examples of the non-volatile memory include memristor devices (also referred to as resistive random-access memory (ReRAM or RRAM)), MRAM (Magnetoresistive random access memory) devices, phase-change memory (PCM) devices, floating gates, spintronic devices, etc. The non-volatile memory device may be in a virgin state and have an initial high resistance before it is subject to a suitable electrical stimulation (e.g., a voltage or current signal applied to the RRAM device). The RRAM device may be tuned to a lower resistance state from the virgin state via a forming process or from a high-resistance state (HRS) to a low-resistance state (LRS) via a setting process. The forming process may refer to programming a device starting from the virgin state. The setting process may refer to programming a device starting from the high resistance state (HRS). The resistance of the non-volatile memory device may be electrically switched between the HRS and the LRS in response to the application of suitable programming signals to the non-volatile memory device (e.g., by applying voltages greater than the threshold switching voltage of the non-volatile memory device).

In some embodiments, a comparator may include at least one non-volatile memory device. Before an analog input voltage is compared to a reference voltage by the comparator, the non-volatile memory device may be programmed to an initial resistance state (e.g., an HRS or an LRS). The reference voltage and the analog input voltage may then be applied to the comparator. The voltage across the non-volatile memory may correspond to a difference between the analog input voltage and the reference voltage. The non-volatile memory device may be in the HRS or the LRS according to the voltage across the non-volatile memory device. As such, the resistance state of the non-volatile memory device in response to the application of the analog input voltage and the reference voltage may indicate the result of the comparison between the analog input voltage and the reference voltage. The comparator may produce a digital output indicative of the resistance state of the non-volatile memory device as the result of the comparison between the analog input voltage and the reference voltage. The digital output may be, for example, a voltage signal indicating whether the non-volatile memory device is in the HRS or the LRS.

In some embodiments, an ADC may include one or more comparators as described herein. Each of the comparators may include at least one non-volatile memory device. Prior to performing analog-to-digital conversion, each non-volatile memory device in the comparators may be programmed to an initial resistance state (e.g., an HRS, an LRS, etc.). The analog input voltage and a plurality of reference voltages may then be applied to the comparators for comparison. Each non-volatile memory device may be in the LRS or HRS according to the voltage across the non-volatile memory device. Each of the comparators may produce a digital output representative of the result of the comparison performed by the comparator (e.g., a voltage signal or a current signal indicating whether the non-volatile memory device is in HRS or LRS). In some embodiments, the digital outputs produced by the comparators may be converted into binary values by an encoder.

The comparators and/or ADC described herein may be used to implement a flash ADC, a pipeline ADC (e.g., to implement an initial coarse stage before a fine-tuning stage), and any other suitable application that utilizes comparators. The ADC design described herein uses a non-volatile memory device (e.g., a two-terminal device such as a memristor device) to replace a CMOS comparator with complex and bulky circuits. Even considering the read and programming circuits in the ADC design, the ADC design described herein may be much smaller than the current flash ADC design. By utilizing non-volatile memory devices, the comparator described herein may be more robust to fluctuations of input voltages and/or reference voltages with non-volatile and hysterical I-V (current-voltage) curves.

FIG. 1 is a schematic diagram illustrating an example 100 of an analog-to-digital converter (ADC) in accordance with some embodiments of the present disclosure.

As shown, ADC 100 may include a voltage divider circuit 110, one or more comparators 120 (e.g., comparators 120*a*, 120*b*, . . . , 120*n*), one or more programming circuits 130, an encoder 140, and any other suitable component for implementing an ADC utilizing non-volatile memory devices as described herein. More or fewer components may be included in ADC 100 without loss of generality. For example, two or more of the components of ADC 100 may be combined into a single module, or one of the components may be divided into two or more modules. In some embodiments, read circuits 123*a-n* may be implemented as circuits that are not part of comparators 120*a-n*.

Figure 3:
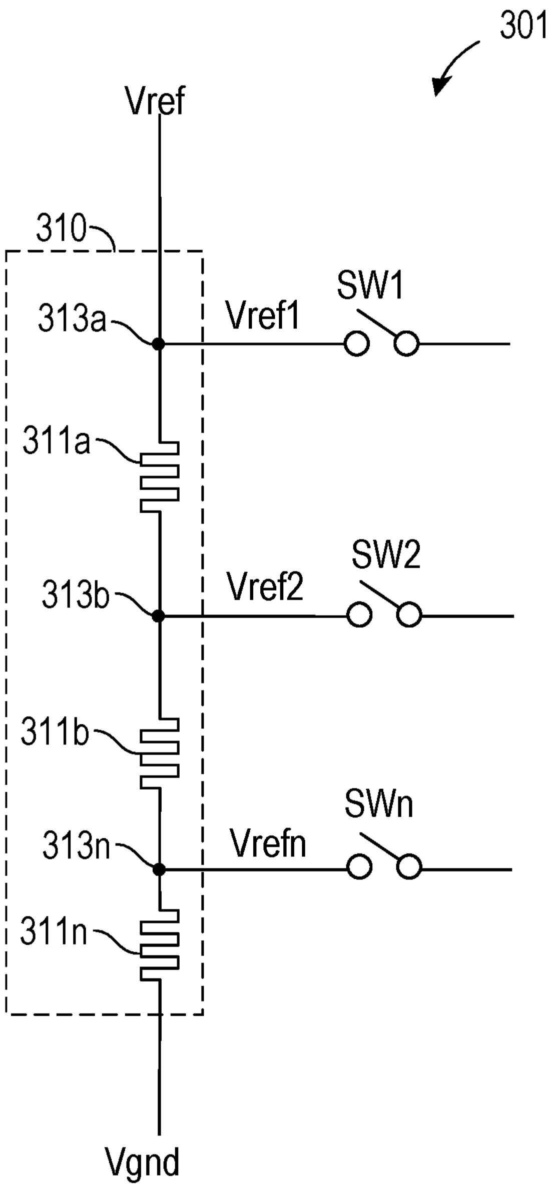
FIG. 3 is a circuit diagram illustrating an example voltage divider circuit in accordance with some embodiments of the present disclosure.

The voltage divider circuit 110 may include one or more resistors, non-volatile memory devices, switches, and/or any other suitable components for performing voltage division and/or any other suitable function to produce reference voltages to be applied to the comparators 120. In some embodiments, the voltage divider circuit 110 may include a resistor ladder. In one implementation, the resistor ladder may include a plurality of resistors (e.g., resistors R11, R12, R13, . . . , R1*n* connected in series as shown in FIG. 1). In another implementation, the resistor ladder and/or voltage divider circuit 110 may include a plurality of non-volatile memory devices as shown in FIG. 3. For example, one or more of resistors R11, R12, R13, . . . , R1*n* may be replaced with one or more non-volatile memory devices.

As shown in FIG. 1, the voltage divider circuit 110 may be connected between two voltages. For example, a first resistor R11 or a first non-volatile memory device may be connected to a first predetermined voltage Vrefp1. An nth resistor R1*n* or an nth non-volatile memory device may be connected to a second predetermined voltage Vrefp2. In some embodiments, the nth resistor or non-volatile memory device may be grounded.

In some embodiments, each tap of the resistor ladder may generate a different voltage that may be used as a reference voltage to be applied to a comparator 120, such as reference voltages Vref1, Vref2, . . . , Vrefn as shown in FIG. 1. The reference voltage Vref1 may represent the full-scale analog input level of the ADC 100. Each of reference voltages Vref2, . . . , Vrefn may represent a fraction of the full-scale analog input level of the ADC 100 (e.g., ⅓ of the full-scale analog input level of the ADC 100, ⅔ of the full-scale analog input level of the ADC 100, etc.).

Each comparator 120*a-n* may receive the analog input voltage Vin and a respective reference voltage as inputs, compare the inputs, and produce an output signal indicative of the result of the comparison. Each comparator 120*a-n* may include at least one non-volatile memory device 121*a-n*. Each non-volatile memory device 121*a-n* may be a two-terminal non-volatile memory device with non-volatile resistance, such as a memristor device (also referred to as a resistive random-access memory (ReRAM or RRAM)), MRAM (Magnetoresistive random access memory), phase-change memory (PCM) devices, floating gates, spintronic devices, etc.

Each comparator 120*a-n* may further include a read circuit 123*a-n* that may generate and/or output a digital output 127*a-n* indicative of the result of the comparison performed by a respective comparator. As will be described in greater detail below, each digital output 127*a-n* may be a voltage signal or a current signal indicative of a resistance state (e.g., HRS, LRS, etc.) of a respective non-volatile memory device 121*a-n* in response to the application of a reference voltage (e.g., Vref1, Vref2, . . . , Vrefn) and the analog input voltage Vin to the comparator that includes the respective non-volatile memory device. In some embodiments, read circuits 123*a-n* may be and/or include one or more portions of read circuit 223*a-n* as described in connection with FIG. 2. In some embodiments, read circuits 123*a-n* may include one or more circuits 400*b* of FIG. 4B below.

To convert the analog input voltage Vin into a digital signal, the programming circuit 130 may program each of the non-volatile memory devices 121*a-n* to an initial resistance state (e.g., by applying a suitable programming voltage to each non-volatile memory device 121*a-n*). The initial resistance state may be an HRS or an LRS. In some embodiments, the programming circuit 130 may include one or more circuits 400*a* as described in connection with FIG. 4A below. Each circuit 400*a* may be used to program a non-volatile memory device 121*a-n* to a suitable resistance.

A comparison process may involve comparing the analog input voltage Vin with each of a plurality of successive reference voltages (e.g., reference voltages Vref1, Vref2, . . . , Vrefn) by the comparators 120. The analog input voltage Vin and a reference voltage Vref1, Vref2, . . . , Vrefn may be applied to each comparator 120*a-n* as inputs for comparison. As shown in FIG. 1, a first reference voltage Vref1 and the analog input voltage Vin may be applied to a first comparator 120*a* (e.g., via switches 113*a* and 115*a*, respectively). A second reference voltage Vref2 and the analog input voltage Vin may be applied to a second comparator 120*b* (e.g., via switch 113*b* and 115*b*, respectively). The nth reference voltage Vrefn and the analog input voltage Vin may be applied to an nth comparator 120*n* (e.g., via switch 113*n* and 115*n*, respectively).

The voltage across a given non-volatile memory device 121*a-n* may correspond to the difference between the analog input voltage Vin and the reference voltage applied to the comparator that includes the non-volatile memory device. The given non-volatile memory device may be in the HRS or the LRS according to the voltage across the non-volatile memory device. As such, the resistance and/or the resistance state of a given non-volatile memory device 121*a-n* (e.g., whether the non-volatile memory device remains in the initial resistance state) may indicate the result of the comparison of Vin with the respective reference voltage (e.g., whether the difference between Vin and the respective reference voltage is greater than the threshold voltage).

The read circuit 123*a*, 123*b*, . . 123*n* may generate and/or output digital outputs 127*a*, 127*b*, . . 127*n* representative of the results of the comparison performed by a corresponding comparator 120*a-n*. Each of digital outputs 127*a-n* may be a voltage signal, a current signal, etc. that may indicate whether a respective non-volatile memory device 121*a-n* is in the initial resistance state. For example, the digital output 127*a* may indicate a first resistance state of the non-volatile memory device 121*a* in response to the application of the reference voltage Vref1 and the application of the analog input voltage Vin to the first comparator 120*a*. As another example, the digital output 127*b* may indicate a second resistance state of the non-volatile memory device 121*b* in response to the application of the reference voltage Vref2 and the application of the analog input voltage Vin to the second comparator 120*b*. The digital outputs 127*a-n* may be and/or include the digital outputs 227*a-n* as described in connection with FIG. 2 below.

In some embodiments, the ADC 100 may further include an encoder 140 that may encode the digital outputs 127*a*, 127*b*, . . 127*n* into a desirable digital format. The encoder 140 may generate one or more binary values (e.g., bits B0, . . . , Bn) based on the digital outputs 127*a*, 127*b*, . . . , 127*n*. Each of the binary values may be a logic "0" or a logic "1." In some embodiments, the encoder 140 may include an error correction logic to suppress bubble errors. In some embodiments, the encoder 140 may include a priority encoder that may compress multiple binary inputs into a smaller number of outputs. In some embodiments, the encoder 140 may be omitted from the ADC 100.

After finishing the ADC process described above, the programming circuit 130 may program the non-volatile memory devices 121*a-n* to the initial resistance state for performing the next analog-to-digital conversion (e.g., the conversion of a next analog signal to a digital signal).

Figure 2:
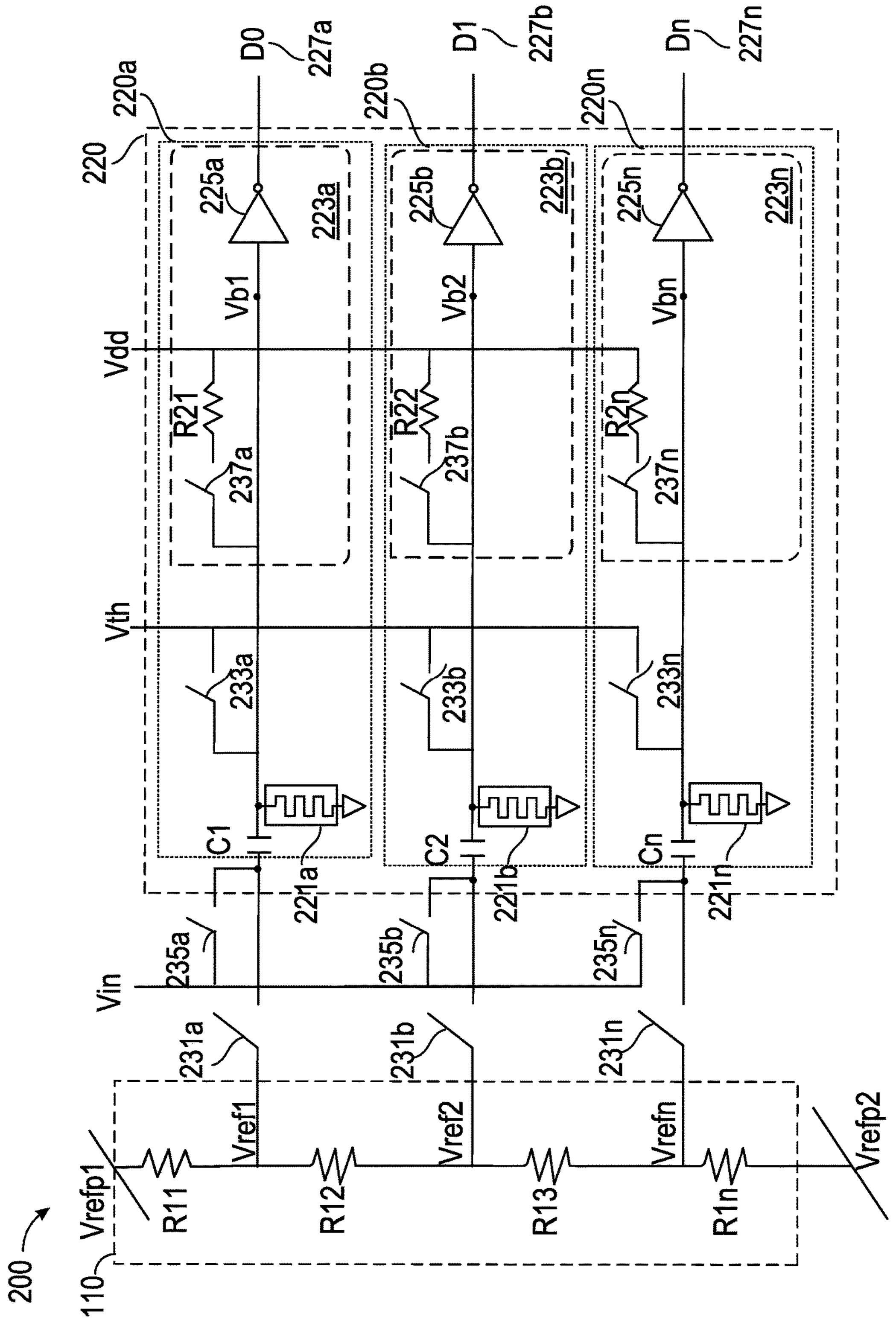
FIG. 2 is a circuit diagram illustrating an example ADC including example comparators and read circuits in accordance with some embodiments of the present disclosure.

FIG. 2 is a circuit diagram illustrating an example ADC 200 including example comparators and read circuits in accordance with some embodiments of the present disclosure.

As shown, ADC 200 may include the voltage divider circuit 110 as described in connection with FIG. 1. ADC 200 may further include one or more comparators 220 (comparators 220*a*, 220*b*, . . . , and 220*n*). Each of the comparators 220 may include one or more non-volatile memory devices (e.g., non-volatile memory devices 221*a*, 221*b*, . . . , and 221*n*). The non-volatile memory devices 221*a-n* may correspond to the non-volatile memory devices 121*a-n* of FIG. 1, respectively. Each of the comparators 220*a-n* may further include a read circuit 223*a*, 223*b*, . . . , 223*n*, one or more capacitors (e.g., capacitor C1, C2, . . . , Cn), one or more switches (e.g., switches 235a, 235b, . . . , 235n), and/or any other suitable component for performing a comparison of two input voltages utilizing the non-volatile memory device as described herein.

Each read circuit 223a-n may include one or more inverters (e.g., inverters 225a, 225b, . . . , 225n) and/or any other suitable components for determining the resistances and/or resistance states of the non-volatile memory devices (e.g., by producing one or more signals indicative of whether each non-volatile memory device is in HRS or LRS). In some embodiments, one or more of the inverters 225a-225n may be replaced with another type of circuitry that may generate a digital output based on an input, such as a buffer.

To convert an analog signal to a digital signal, each non-volatile memory device 221a-n may be programmed to an initial resistance state (e.g., an HRS or an LRS) by a programming circuit (not shown in FIG. 2).

During a first processing cycle, a reference voltage and a threshold voltage Vth may be applied to each capacitor C1, C2, . . . , Cn. For example, switches 231a, 231b, . . . , 231n may be closed to connect a first terminal of each capacitor C1, C2, . . . , Cn to a respective reference voltage Vref1, Vref2, . . . , Vrefn. Switches 233a, 233b, . . . , 233n may be closed to connect a second terminal of each capacitor C1, C2, . . . , Cn to a threshold voltage Vth. At the end of the first processing cycle, the charges accumulated on a respective capacitor C1, C2, . . . , Cn may correspond to the difference between the threshold voltage Vth and the respective reference voltage applied to the capacitor.

During a second processing cycle, an analog input voltage Vin may be applied to each capacitor C1, C2, . . . , Cn. For example, switches 231a-n and 233a-n may be open while switches 235a, 235b, . . . , 235n may be closed to connect the first terminal of each capacitor C1, C2, . . . , Cn to the analog input voltage Vin. The voltage Vbi (i.e., Vb1, Vb2, . . . , Vbn) as shown in FIG. 2 may be Vth+(Vin−Vrefi), where i=1, 2, . . . , n. As such, the voltage across a respective non-volatile memory device 221a-n may correspond to a difference between the analog input voltage Vin and the reference voltage applied to the comparator that includes the non-volatile memory device. The resistance and/or resistance state of the given non-volatile memory device may or may not change according to the difference between the reference voltage and Vin. For example, the non-volatile memory device may remain in the initial resistance state if the difference between Vin and the reference voltage applied to the non-volatile memory device is not greater than a certain trigger voltage. The non-volatile memory device may be switched from the initial resistance state to a resistance state that is different from the initial resistance state if the difference between Vin and the reference voltage applied to the non-volatile memory device is greater than a certain trigger voltage. The non-volatile memory device may be in the LRS or the HRS according to the voltage across the non-volatile memory devices.

During a third processing cycle, switches 237a, 237b, . . . , 237n may be closed to connect a resistor (e.g., resistor R21, R22, . . . , R2n) between a voltage Vdd and a respective non-volatile memory device 221a-n. The voltage Vbi may be either higher or lower than the trigger voltage of the inverter. The resistance of resistor R21, R22, . . . , R2n may be a value between the resistance of non-volatile memory devices 221a-n in the LRS and the resistance of non-volatile memory devices 221a-n in the HRS. Switches 231a-n, 235a-n, and 233a-n may be open during the third processing cycle. An input of an inverter (Vbi) connected to a non-volatile memory device may be low or high according to the resistance state of the non-volatile memory device. For example, the input applied to an inverter 225a-n may be low if the non-volatile memory device connected to the inverter is in the LRS. Similarly, the input applied to the inverter 225a-n may be high if the non-volatile memory device connected to the inverter is in the HRS.

The inverter may then output a voltage 227a-n (e.g., signals D0, D1, . . . , Dn, as shown in FIG. 2) representing the opposite logic level of its input Vbi. In some embodiments, the inverters 225a-n may be replaced with buffers or any other suitable components that may produce digital outputs based on the inputs applied to the inverters 225a-n.

In some embodiments, the non-volatile memory devices 221a-n may be programmed to the initial resistance state for performing the next analog-to-digital conversion during a fourth processing cycle. For example, a suitable programming voltage may be applied to each of non-volatile memory devices 221a-n to program the non-volatile memory devices 221a-n to the initial resistance state (e.g., the HRS or the LRS). The ADC 200 may perform analog-to-digital conversion on another analog signal by carrying out the operations performed in the first processing cycle through the third processing cycle.

FIG. 3 is a circuit diagram illustrating an example voltage divider circuit 301 in accordance with some embodiments of the present disclosure.

As shown, the voltage divider circuit 301 may include a resistor ladder 310, one or more switches SW1, SW2, . . . , SWn, and/or any other suitable components for performing voltage division and/or voltage generation functions. The resistor ladder 310 may include a plurality of non-volatile memory devices 311a, 311b, . . . , 311n. In some embodiments, the non-volatile memory devices are connected in series. The resistor ladder 310 may receive a predetermined voltage or a predetermined current to produce a plurality of reference voltages. For example, the resistor ladder 310 may be connected between a first voltage Vref and a second voltage to produce reference voltages Vref1, Vref2, . . . , Vrefn as shown in FIG. 3. A first non-volatile memory device 311a may be connected to the first voltage (e.g., a reference voltage Vref). The nth non-volatile memory device 311n may be connected to the nth voltage (e.g., be grounded). Each tap 313a, 313b, . . . , 313n of the resistor ladder (e.g., a connection point between the non-volatile memory devices 311a-n) may generate a different voltage that may be used as a reference voltage Vref1, Vref2, . . . , Vrefn. Each non-volatile memory device 311a, 311b, . . . , 311n can be programmed to a desirable resistance by applying a suitable programming voltage to the non-volatile memory device (e.g., through a suitable circuit that is capable of applying the programming voltage, such as one or more circuits 400a of FIG. 4A). In some embodiments, one or more non-volatile memory devices 311a-n may be programmed to a desirable high resistance to reduce the DC current and power consumption of an apparatus (e.g., an ADC) utilizing the voltage divider circuit 301. For example, one or more non-volatile memory devices 311a-n may be programmed to tens of Mohm, hundreds of Mohm, or thousands of Mohm for implementing applications with a current consumption of a few nanoamps.

Figure 4A:
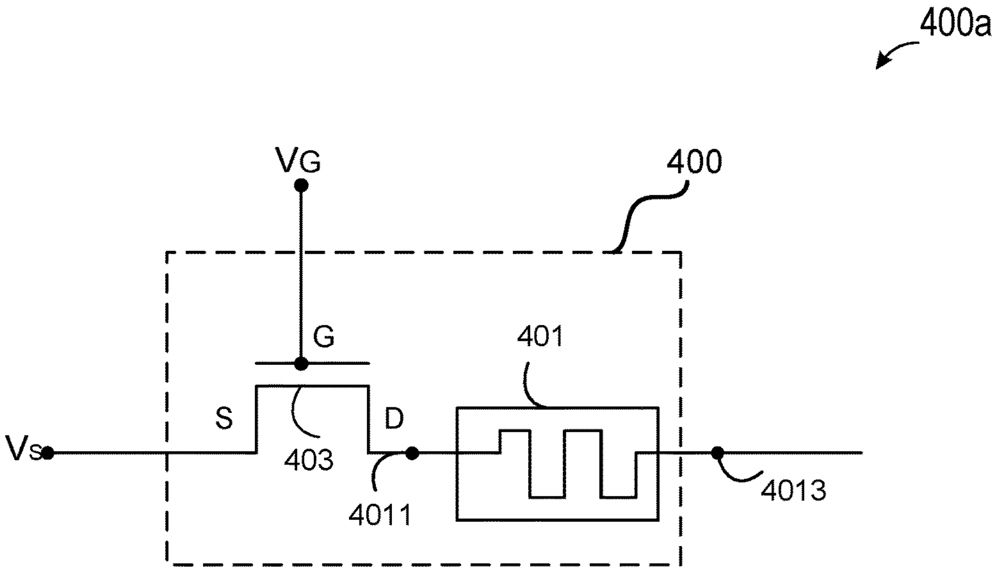
FIG. 4A is a circuit diagram illustrating an example writing circuit in accordance with some embodiments of the present disclosure.

FIG. 4A is a schematic diagram illustrating an example 400a of a circuit for programming a non-volatile memory device in accordance with some embodiments of the present disclosure.

As shown, a non-volatile memory device 401 may be serially connected to a transistor 403. The non-volatile memory device 401 and the transistor 403 may also be referred to as a one-transistor-one-resistor (1T1R) configuration 400*a*. The transistor 403 may include three terminals marked as gate (G), source (S), and drain (D), respectively. In some embodiments, a first terminal 4011 (e.g., a first electrode) of the non-volatile memory device 401 may be connected to the drain of transistor 403. The transistor 403 may perform as a selector as well as a current controller, which may set the current compliance to the non-volatile memory device 401 during programming. The gate voltage on transistor 403 can set current compliances to the non-volatile memory device 401 during programming and can thus control the conductance and analog behavior of the non-volatile memory device 401. For example, to program the non-volatile memory device 401 to a low-resistance state (e.g., setting the non-volatile memory device 401 or programming the non-volatile memory device 401 to a relatively lower resistance), a set signal (e.g., a voltage signal, a current signal) may be applied to a second terminal 4013 of the non-volatile memory device. Another voltage (also referred to as a select, wordline, or gate voltage) may be applied to the transistor gate to open the gate and set the current compliance, while the source of the transistor 403 may be grounded. To program the non-volatile memory device 401 to a high-resistance state (e.g., resetting the non-volatile memory device 401 from the low-resistance state to the high-resistance state or programming the non-volatile memory device 401 to a higher resistance), a gate voltage may be applied to the gate of the transistor 403 to open the transistor gate. Meanwhile, a reset signal may be applied to the source of the transistor 403, while the second terminal 4013 of the non-volatile memory device may be grounded.

Figure 4B:
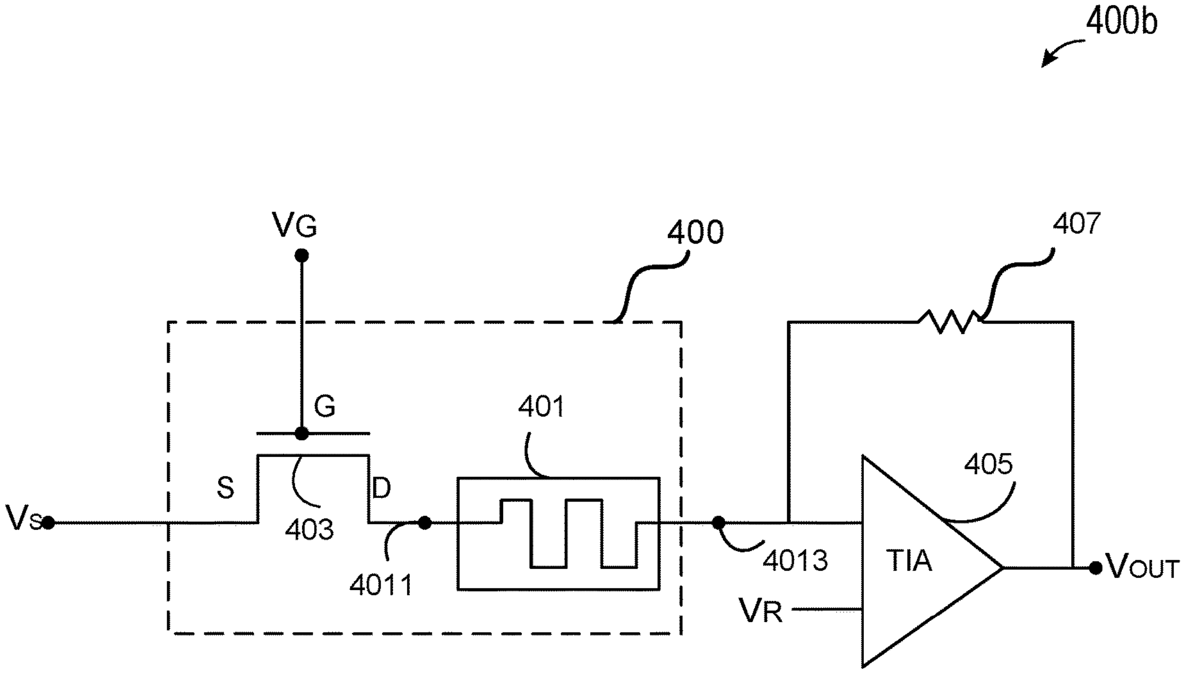
FIG. 4B is a circuit diagram illustrating an example read circuit in accordance with some embodiments of the present disclosure.

FIG. 4B is a schematic diagram illustrating an example 400*b* of a circuit for reading a resistance and/or resistance state of a non-volatile memory device in accordance with some embodiments of the present disclosure. As shown, the non-volatile memory device 401 may be connected to a transimpedance amplifier (TIA) 405 that may perform current-to-voltage conversion and output a voltage signal Vout. To read the resistance and/or the resistance state of the non-volatile memory device, voltages $V_G$, $V_S$, and $V_R$ may be applied to the gate of the transistor 403, the source of the transistor 403, and the TIA 405, respectively. The TIA 405 may be connected to a feedback resistor 407. The output voltage Vout of the TIA 405 may represent the current passing through the non-volatile memory device and may thus represent the resistance and/or resistance state of the non-volatile memory device 401.

Figure 5:
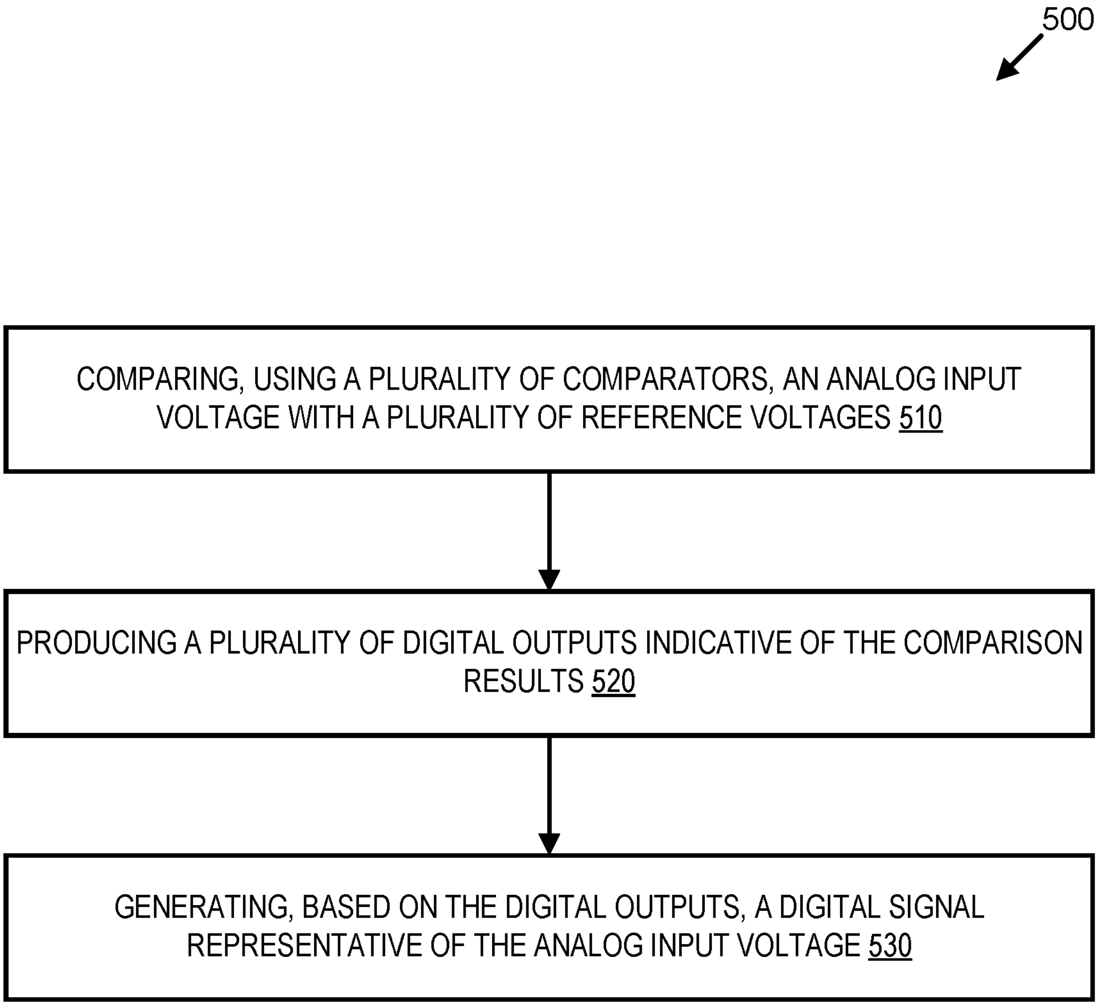
FIGS. 5 and 6 are flow charts illustrating example processes for performing analog-to-digital conversion in accordance with some embodiments of the present disclosure.

FIG. 5 is a flow chart illustrating an example process 500 for performing analog-to-digital conversion in accordance with some embodiments of the present disclosure. Process 500 may be implemented using an ADC as described herein (e.g., ADC 100 and/or ADC 200).

Process 500 may start at block 510 where an analog input voltage may be compared with a plurality of reference voltages using a plurality of comparators. Each of the comparators may include at least one non-volatile memory device (e.g., comparators 120*a-n* of FIG. 1 and/or comparators 220*a-n* of FIG. 2). For example, the non-volatile memory devices in the comparators may be programmed to an initial resistance state. The initial resistance state may be an HRS or an LRS. A respective reference voltage and the analog input voltage may be applied to each of the comparators. For example, a first reference voltage, a second reference voltage, and an nth reference voltage of a plurality of successive reference voltages may be applied to a first non-volatile memory device, a second non-volatile memory device, and an nth non-volatile memory device, respectively, as a first input. The analog input voltage may be applied to each of the first non-volatile memory device, the second non-volatile memory device, and the nth non-volatile memory device as a second input. In some embodiments, performing the comparison by each comparator may involve performing one or more operations as described in connection with FIG. 6 below.

At block 520, one or more digital outputs indicative of the comparison results may be produced. Each of the digital outputs may correspond to the resistance state of a non-volatile memory device. The digital outputs may be the digital outputs 127*a-n* as described in connection with FIG. 1 and/or the digital outputs 227*a-n* as described in connection with FIG. 2. The digital outputs may be generated by one or more read circuits (e.g., read circuits 223*a-n* of FIG. 2) that may output voltage signals, current signals, etc. that may indicate the resistance states of the non-volatile memory devices.

In some embodiments, a digital signal representative of the analog input voltage may be generated at 530. The digital signal may be generated based at least in part on the digital outputs produced by the comparators (e.g., the first digital output produced by the first comparator, the second digital output produced by the second comparator, etc.). In some implementations, the digital signal may be the digital outputs. In some implementations, the digital signal may be generated by the encoder 140 of FIG. 1 (e.g., by converting the digital outputs into binary values in a suitable format).

Figure 6:
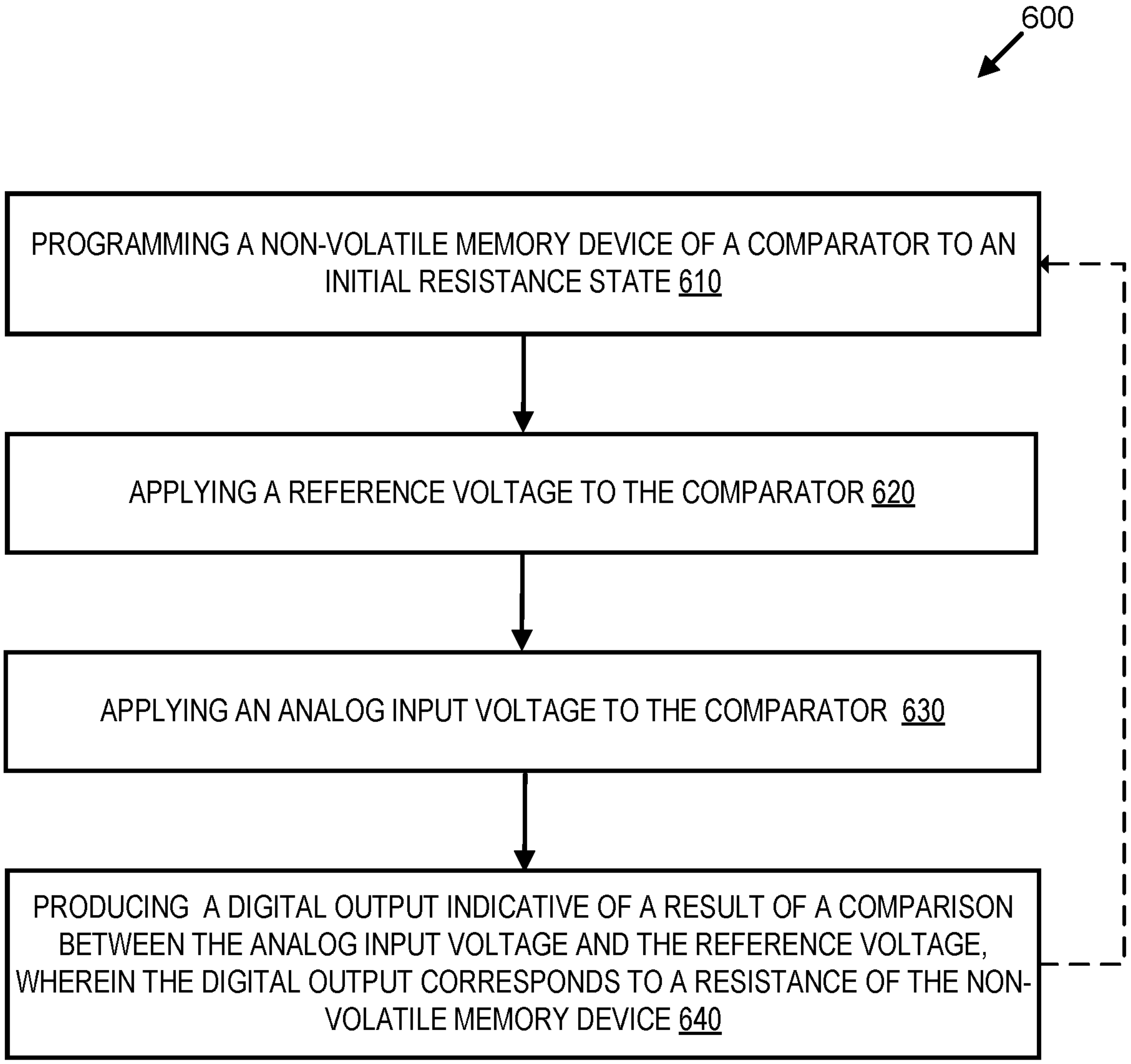

Referring to FIG. 6, a flow chart illustrating an example process 600 for performing analog-to-digital conversion utilizing a comparator including a non-volatile memory device is shown. Process 600 may be executed by a comparator 120*a-n* and/or a comparator 220*a-n* as described in connection with FIGS. 1-2 above.

Process 600 may start at 610 where the non-volatile memory device may be programmed to an initial resistance state. For example, a suitable programming voltage (e.g., a resetting voltage, a setting voltage, etc.) may be applied to each of the non-volatile memory devices to program the non-volatile memory device to the initial resistance state. In some embodiments, the programming voltage may be applied to the non-volatile memory devices by programming circuit 130 of FIG. 1 and/or one or more circuits 400*a* of FIG. 4A.

At 620, a reference voltage may be applied to the comparator. For example, the reference voltage may be applied to a first terminal of a capacitor connected to the non-volatile memory device at 621. A threshold voltage may be applied to a second terminal of the capacitor as described in connection with FIG. 2.

At block 630, an analog input voltage may be applied to the comparator. For example, the analog input voltage Vin may be applied to the first terminal of the capacitor as described in connection with FIG. 2.

At block 640, the comparator may produce a digital output indicative of a result of a comparison between the analog input voltage and the reference voltage. The digital output may be a voltage signal or a current signal indicating whether the non-volatile memory device is in the initial resistance state in response to the application of the reference voltage and the analog input voltage to the comparator. The digital output may be, for example, a voltage signal or a current signal indicative of whether the non-volatile memory device is in the LRS or the HRS. The digital output may be a digital output 127*a-n* of FIGS. 1 and/or 227*a-n* of FIG. 2. In some embodiments, a resistor (e.g., resistor R21, R22, . . . , R2n of FIG. 2) may be connected to the non-volatile memory device and/or an inverter that produces the digital output. For example, as described in connection with FIG. 2, a resistor R21 may be connected to non-volatile memory device 221a and/or inverter 225a to create a voltage Vb1. Vb1 may be either higher or lower than the trigger voltage of the inverter 225a in accordance with the resistance state of non-volatile memory device 221a. The resistance of the resistor R21 may be a value between the resistance of the non-volatile memory device 221a in the LRS and the resistance of non-volatile memory devices 221a in the HRS.

In some embodiments, process 600 may loop back to 610 after executing block 640. For example, the non-volatile memory device may be programmed to the initial resistance state for performing a next analog-to-digital conversion.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:

a first comparator comprising a first non-volatile memory device, wherein the first comparator is to:

receive a first reference voltage and an analog input voltage as inputs; and produce a first digital output indicative of a result of a comparison between the analog input voltage and the first reference voltage, wherein the first non-volatile memory device comprises a first memristor device, wherein the first digital output indicates whether the first memristor device remains in an initial resistance state after an application of the first reference voltage and the analog input voltage to the first comparator, wherein the first memristor device is programmed to the initial resistance state before the application of the first reference voltage and the application of the analog input voltage to the first comparator, wherein the initial resistance state comprises a high-resistance state or a low-resistance state, and wherein the first memristor device switches from the initial resistance state to a different resistance state when a voltage across the first memristor device that corresponds to a difference between the first reference voltage and the analog input voltage is greater than a trigger voltage.

2. The apparatus of claim 1, further comprising:

an encoder to generate one or more binary values based at least in part on the first digital output generated by the first comparator.

3. The apparatus of claim 1, further comprising:

one or more programming circuits to program the first memristor device to the initial resistance state.

4. The apparatus of claim 1, further comprising:

a second comparator comprising a second non-volatile memory device, wherein the second non-volatile memory device comprises a second memristor device, wherein the second comparator is to generate a second digital output indicative of a result of a comparison of the analog input voltage with a second reference voltage, wherein the second digital output represents a second resistance state of the second memristor device in response to an application of the second reference voltage and an application of the analog input voltage to the second comparator.

5. The apparatus of claim 4, wherein the second digital output indicates whether the second resistance state of the second memristor device is the high-resistance state or the low-resistance state.

6. The apparatus of claim 4, wherein the second memristor device is programmed to the initial resistance state before the application of the second reference voltage and the application of the analog input voltage to the second comparator, and wherein the second digital output comprises a voltage signal indicative of whether the second memristor device remains in the initial resistance state after the application of the second reference voltage and the application of the analog input voltage to the second comparator.

7. The apparatus of claim 1, further comprising a voltage divider circuit to generate a plurality of reference voltages, wherein the plurality of reference voltages comprises the first reference voltage.

8. The apparatus of claim 7, wherein the voltage divider circuit comprises a plurality of non-volatile memory devices connected in series.

9. A method for performing analog-to-digital conversion, comprising:

programming a first memristor device to an initial resistance state by applying a programming voltage to the first memristor device;

applying, to a first comparator comprising the first memristor device that is programmed to the initial resistance state, a first reference voltage;

applying an analog input voltage to the first comparator;

producing, using the first comparator, a voltage signal representing whether the first memristor device remains in the initial resistance state after the application of the first reference voltage and the analog input voltage to the first comparator, wherein the initial resistance state comprises a high-resistance state or a low-resistance state, and wherein the first memristor device switches from the initial resistance state to a different resistance state when a voltage across the first memristor device that corresponds to a difference between the first reference voltage and the analog input voltage is greater than a trigger voltage; and producing, based on the voltage signal, a first digital output indicative of a result of a comparison between the analog input voltage and the first reference voltage.

10. The method of claim 9, further comprising:

generating, by an encoder, one or more binary values based at least in part on the first digital output.

11. The method of claim 9, wherein the first digital output indicates whether the first memristor device is in the high-resistance state or the low-resistance state.

12. The method of claim 9, further comprising:

programming the first memristor device to the initial resistance state after producing the first digital output.

13. The method of claim 9, further comprising:

applying, to a second comparator comprising a second memristor device, a second reference voltage and the analog input voltage; and producing, using the second comparator, a second digital output indicative of a result of a comparison between the analog input voltage and the second reference voltage.

14. The method of claim 13, wherein the second digital output indicates whether the second memristor device is in the high-resistance state or the low-resistance state.

15. The method of claim 9, further comprising producing, using a voltage divider circuit, a plurality of reference voltages comprising the first reference voltage, wherein the voltage divider circuit comprises at least one non-volatile memory device.

* * * * *